(12) United States Patent
Chua et al.

(10) Patent No.: US 6,199,464 B1
(45) Date of Patent: Mar. 13, 2001

(54) METHOD AND APPARATUS FOR CUTTING A SUBSTRATE

(75) Inventors: Kok Hua Chua; Jinhan Ju; Kim Hwee Tan, all of Singapore (SG)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/351,546

(22) Filed: Jul. 12, 1999

(51) Int. Cl.$^7$ ........................................ B26D 3/00
(52) U.S. Cl. ........................ 83/13; 83/140; 83/690; 83/929.1
(58) Field of Search ........................ 257/787, 788, 257/790, 793; 83/13, 39, 49, 50, 140, 453, 465, 690, 929.1, 929.2

(56) References Cited

U.S. PATENT DOCUMENTS

| | | | |
|---|---|---|---|
| 4,077,443 | 3/1978 | Coller et al. | 141/111 |
| 4,425,829 | 1/1984 | Kranik et al. | 83/62.1 |
| 4,653,365 | 3/1987 | Takasaki et al. | 83/50 |
| 5,042,352 | * 8/1991 | Lux | 83/690 |
| 5,612,576 | 3/1997 | Wilson et al. | 257/788 |
| 5,701,790 | * 12/1997 | Saito | 83/140 |
| 5,767,446 | 6/1998 | Ha et al. | 174/52.4 |
| 5,786,239 | 7/1998 | Ohsawa et al. | 438/123 |
| 5,813,108 | 9/1998 | Ryan | 29/564.6 |
| 5,813,301 | * 9/1998 | Fujita | 83/140 |

* cited by examiner

Primary Examiner—W. Donald Bray
(74) Attorney, Agent, or Firm—Duane Morris & Heckscher LLP; Steven E. Koffs

(57) ABSTRACT

An apparatus cuts a substrate having first and second portions, each portion having a respectively different level. A first support surface is located at a first level. The first portion of the substrate is supported by the first support surface. A second support surface is located at a second level different from the first level. The second portion of the substrate is supported by the second support surface. The first and second support surfaces are first and second die surfaces, respectively. A punch cuts the substrate between the first support surface and the second support surface. The punch has a V-shaped cross section. A stripper plate has first and second portions. The punch is positioned between the first and second portions of the stripper plate. The first portion of the substrate is clamped between the first portion of the stripper plate and the first die surface. The second portion of the substrate is clamped between the second portion of the stripper plate and the second die surface. The punch punches a cut in the substrate in the form of a straight line segment, without causing cracks in the solder resist layer of the substrate.

23 Claims, 3 Drawing Sheets

31

METHOD AND APPARATUS FOR CUTTING A SUBSTRATE

FIELD OF THE INVENTION

The present invention relates to semiconductor fabrication methods and an apparatus therefor.

DESCRIPTION OF THE RELATED ART

Techniques are well known for confining solder to appropriate areas of an electrical device while preventing the solder from flowing through all portions of the device and thereby destroying or impairing its functioning. The small size of such devices produces a strong wicking or capillary action in any melted solder which is applied to the device, so that solder is often drawn throughout the device by the wicking action, preventing the device from functioning properly. As a result it is often necessary to apply a solder resist material which resists the flow of solder, to various portions of a device to combat the wicking or capillary action.

Frequently, it is desirable to cut an organic substrate having a solder resist on it, by using a punch. FIG. 1 shows an enlarged view of a cutting portion of a conventional apparatus 10 for cutting an organic substrate or printed circuit board (PCB) 30. Only the rightmost portion of the substrate 30 is shown.

The substrate 30 may have an integrated circuit (IC) chip (not shown) on its top surface. An example of such a PCB with an IC chip mounted thereon is provided in U.S. Pat. Nos. 5,612,576 and 5,767,466, the disclosures of which are specifically incorporated herein by reference. (See FIG. 1, PCB 12 and chip 22 in U.S. Pat. No. 5,612,576, and FIG. 1A, PCB 20 and chip 30 in U.S. Pat. No. 5,767,446.)

Referring again to FIG. 1, substrate 30 may contain a plurality of layers including conductive wirings, which are well known in the art. The substrate 30 has a ball grid array, including solder balls 36 on a surface of the substrate. The solder balls 36 are formed on electrodes 38. Electrodes 38 are coupled to circuits (not shown) within the substrate 30. A solder resist layer 37 is formed on the surface of the substrate 30, to prevent the solder from flowing to the regions that are shielded by the solder resist 37. Another solder resist layer 35 is provided on the top side of the substrate 30. An overmold 40 is provided on the side of the Substrate 30 opposite the solder balls 36. The overmold 40 encapsulates and protects the IC chip (not shown) that is bonded to the substrate 30, along with the wires (not shown) that are used to wire bond the IC chip to the substrate 30.

FIG. 1 shows a simplified view of the cutting mechanism of the punch mechanism. A detailed explanation of the operation of a punch is not included herein. Details of an exemplary conventional punch mechanism are described in U.S. Pat. No. 4,425,829, the disclosure of which is specifically incorporated herein by reference. The conventional punch apparatus 10 of FIG. 1 has a bottom die 20 beneath the substrate, and a stripper 14 and punch plate 16 above the substrate. The punch plate 16 and the punch 12 are actuated downward together, for example, by a single plate 17 overlying both the punch plate 16 and the punch 12; the plate 17 is actuated downward by an actuator 19. The stripper plate 14 and punch plate 16 are coupled by springs 18, so that stripper 14 can move upward relative to the punch 12. The bottom die 20 supports the substrate 30 for cutting.

In a punch operation, the punch plate 16 and punch 12 are actuated downwards towards the substrate. When the surface 15 of the stripper plate 14 contacts the substrate 30, the springs 18 are compressed, and stripper plate 14 moves upward relative to punch plate 16, so that further displacement of the punch plate 16 does not cause the stripper plate 14 to crush the substrate 30. Meanwhile, the punch 12 is driven downward through the substrate 30. Because the bottom die 20 supports the underside of the substrate 30, the punch 12 shears the substrate.

FIG. 2 shows a device 31 after completion of the punch operation. Undesirably, stress created by the punch force frequently causes cracks 50 in the solder resist 37. About 85% of the substrates cut in the apparatus of FIG. 1 exhibit solder resist cracks.

These crack lines propagate on the solder resist 37 along the line of impact by the punch 12.

Various attempts have been made to solve the problem of solder resist cracking. These attempted solutions include: using a different punch profile; varying the clearance between the die and the punch; varying the speed of the cutting, placing a rubber shock absorber beneath the die, and combinations of these techniques. Of these attempted solutions, only the rubber shock absorber has been found to help reduce the solder resist cracks at the edge of the substrate. Unfortunately, the very short useful life of the shock absorber makes this solution impractical to implement in production.

A more practical technique for reducing solder resist cracking is desired.

SUMMARY OF THE INVENTION

The present invention is a method for cutting a substrate and a substrate formed by the method. The substrate has first and second portions, each portion having a respectively different level. The first portion of the substrate is supported on a first support surface at a first level, and the second portion of the substrate is supported on a second support surface at a second level. The substrate is cut between the first support surface and the second support surface.

Another aspect of the invention is an apparatus for cutting a substrate having first and second portions, each portion having a respectively different level. The apparatus has a first support surface at a first level. The first portion of the substrate is supported by the first support surface. The apparatus has a second support surface at a second level. The second portion of the substrate is supported by the second support surface. The apparatus also has a punch that cuts the substrate between the first support surface and the second support surface.

DETAILED DESCRIPTION

Figure 3:
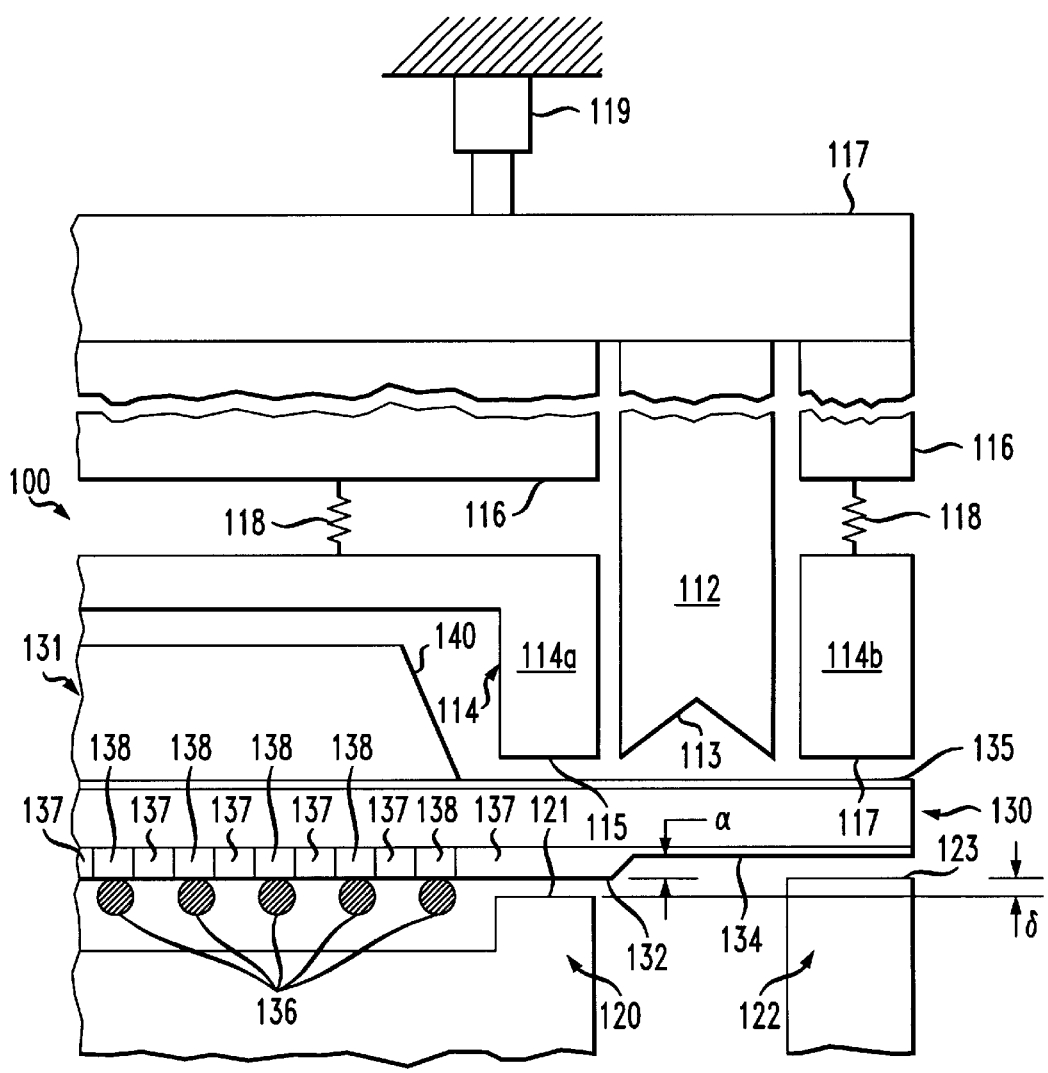
FIG. 3 is side elevation view of an exemplary punch apparatus according to the invention.

FIG. 3 shows an exemplary apparatus 100 according to the present invention. Substrate 130 has a first portion 132 and a second portion 134. Each of the portions 132 and 134 has a respectively different level, separated by a distance $\alpha$. Both portions 132 and 134 have a solder resist layer 137. The solder resist layer 137 is thicker on the first portion 134 than on the second portion 134. Another solder resist layer 135 is provided on the top side of the substrate 130. The first and second support surfaces 121 and 123 are respective first and second surfaces of the bottom die 120, 122.

The first portion 132 of the substrate 130 is supported by the first support surface 121. The first support surface 121 is located at a first level.

The second portion 134 of the substrate 130 is supported by the second support surface 123. The second support surface 123 is located at a second level different from the first level. Preferably, the distance δ between the first support surface 121 and the second support surface 123 is substantially equal to the distance α between the respective surfaces of the first and second substrate portions 132 and 134.

Using the exemplary apparatus, the punching is performed substantially without flexing the substrate. A typical maximum flexure would be about 50 microns (0.050 mm). A possible mechanism for the reduction in the solder resist cracking provided by an exemplary apparatus according to the invention is that supporting the first portion 132 and the second portion 134 of the substrate 130 at the first and second levels, respectively, provides firm clamping of both portions 132 and 134 of the substrate, and prevents cantilever bending of the second portion 134 of the substrate. A cantilever-type bending causes both tensile and compressive stress and strain in the axial direction. The tensile strain may be a contributor to the solder resist cracks in conventional substrates cut using conventional punching apparatus and methods.

A punch 112 cuts the substrate 130 between the first support surface 121 and the second support surface 123. A stripper plate 114 has first and second portions 114a and 114b. The punch 112 is positioned between the first and second portions 114a, 114b of the stripper plate 114. The first portion 132 of the substrate 130 is clamped between the first portion 114a of the stripper plate 114 and the first die surface 121. The second portion 134 of the substrate 130 is clamped between the second portion 114b of the stripper plate 114 and the second die surface 123.

Figure 2:
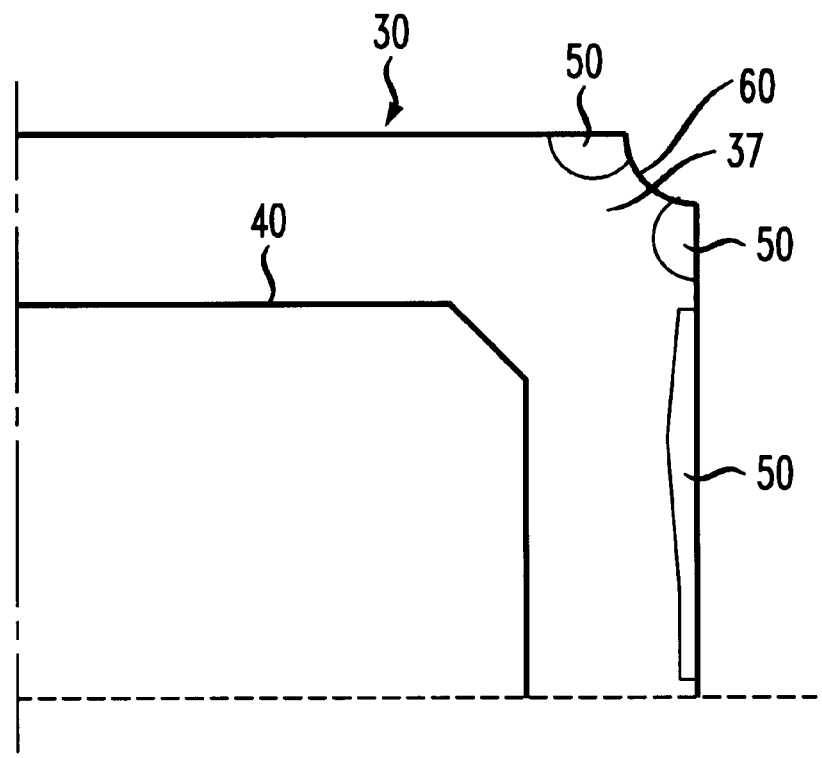
FIG. 2 is a plan view of the substrate cut by the conventional punch apparatus of FIG. 1.

The punch 112 punches a cut in the substrate 130 in the form of a straight line segment. The cut intercepts a pre-drilled hole in the substrate. The pre-drilled hole (not shown) in substrate 130 is similar to the predrilled hole 60 shown in FIG. 2.

The exemplary punch 112 has a V-shaped cross section 113. The combination of supporting the substrate 130 at respectively different levels and using a V-shaped punch 112 to cut the substrate may provide even greater reduction in solder resist cracking. Using the combination, the punching is performed substantially without cracking the solder resist layer 137. The cut edge of the substrate 130 is sharp and well defined.

Figure 1:
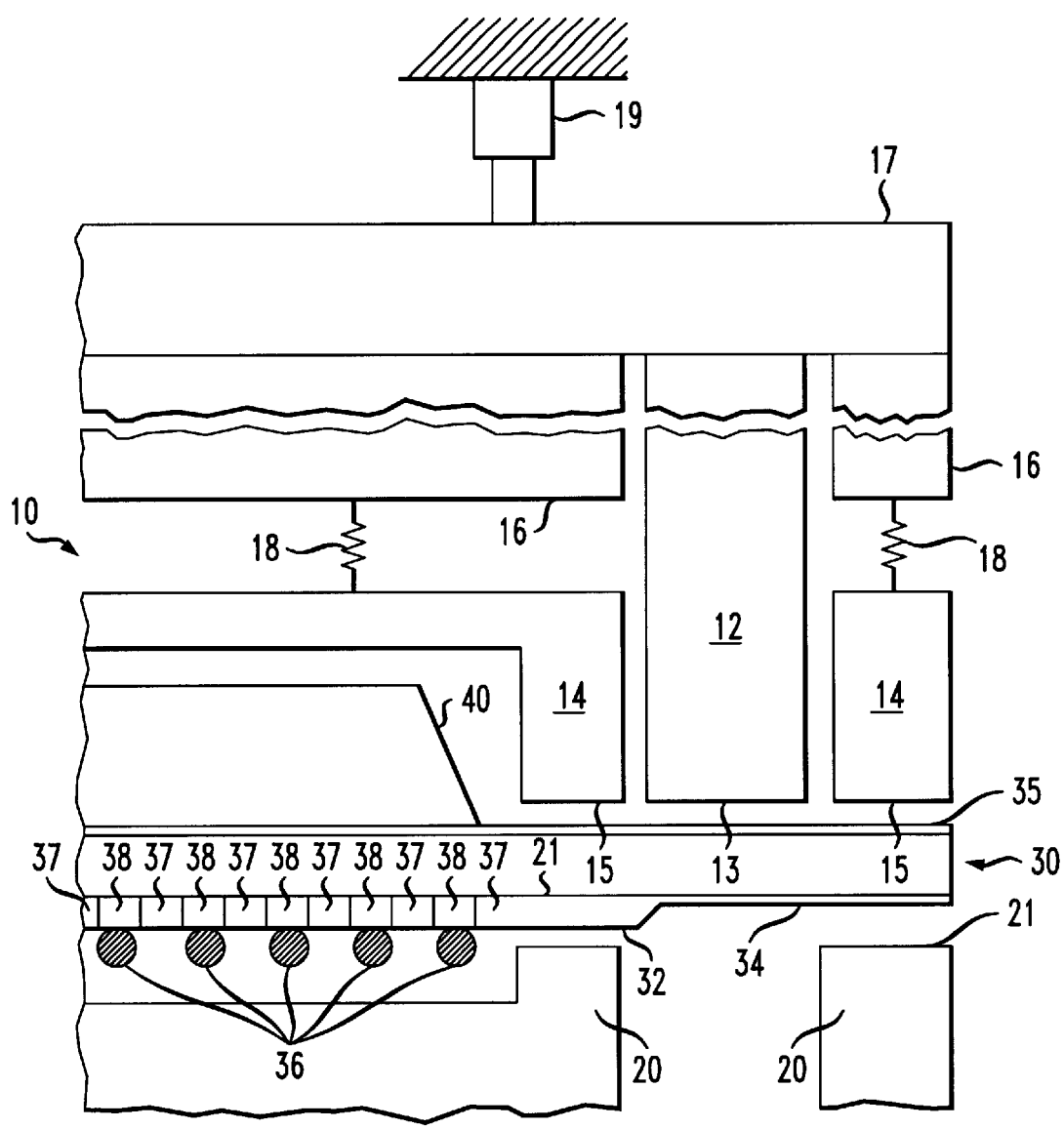
FIG. 1 is a side elevation view of a conventional punch apparatus.

By way of comparison, the typical solder resist crack defect rate for the prior art apparatus of FIG. 1 is about 85%. Using the apparatus of FIG. 3, however, the defect rate is reduced to less than 50 parts per million.

Other features of the punch apparatus 100 and device 131 of FIG. 3 may be similar to those included in the conventional punch apparatus of FIG. 1. Substrate 130 may contain a plurality of layers including conductive wirings, which are well known in the art. The substrate 130 may have a ball grid array, including solder balls 136 on a surface of the substrate. The solder balls 136 are formed on electrodes 138. Electrodes 138 are coupled to circuits (not shown) within the substrate 130. A solder resist layer 137 is formed on the surface of the substrate 130, to prevent the solder from flowing to the regions that are shielded by the solder resist 137. An overmold 140 may be provided on the side of the Substrate 130 opposite the solder balls 136. The overmold 140 encapsulates and protects the IC chip (not shown) that is bonded to the substrate 130, along with the wires (not shown) that are used to wire bond the IC chip to the substrate 130.

The punch apparatus 100 has a bottom die 120 beneath the substrate, and a stripper 114 and punch plate 116 above the substrate. The punch plate 116 and the punch 112 are actuated downward together, for example, by a single plate 117 overlying both the punch plate 116 and the punch 112; the plate 117 is actuated downward by an actuator 119. The stripper plate 114 and punch plate 116 are coupled by springs 118, so that stripper 114 can move upward relative to the punch 112. The bottom die supports the substrate 130 for cutting.

In a punch operation, the punch plate 116 and punch 112 are actuated downwards towards the substrate. When the surface 115 of the stripper plate 114 contacts the substrate 130, the first portion 132 of the substrate 130 is clamped at the first level, between the stripper portion 114a and the first support surface 121. The second portion 134 of the substrate 130 is clamped at the second level, between the stripper portion 114b and the second support surface 123. The springs 118 are compressed, and stripper plate 114 moves upward relative to punch plate 116, so that further displacement of the punch plate 116 does not cause the stripper plate 114 to crush the substrate 130. Meanwhile, the punch 112 is driven downward through the substrate 130. Because the support surfaces 121 and 123 of bottom die 120, 122 supports the underside of the substrate 130, the punch 112 shears the substrate.

The exemplary embodiments described above are advantageous. Existing substrate designs may be used without re-design. Cutting tool life is increased, and operating costs are reduced.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A method for cutting a substrate having first and second portions, each portion having a respectively different level, comprising the steps of:
supporting the first portion of the substrate on a first support surface at a first level;
supporting the second portion of the substrate on a second support surface at a second level; and
cutting the substrate between the first support surface and the second support surface.

2. The method of claim 1, wherein the step of cutting includes punching the substrate.

3. The method of claim 2, wherein the substrate has a solder resist layer thereon, and the punching is performed substantially without cracking the solder resist layer.

4. The method of claim 2, wherein the substrate has a solder resist layer thereon, and the punching is performed without significantly flexing the substrate.

5. The method of claim 2, wherein the step of punching includes punching a cut in the substrate in the form of a straight line segment.

6. The method of claim 5, wherein the cut intercepts a pre-drilled hole in the substrate.

7. The method of claim 2, wherein the cutting step is performed using a punch having a V-shaped cross section.

8. A substrate having a first portion at a first level and a second portion at a second level, the substrate being formed by the steps of:
   supporting the first portion of the substrate on a first support surface at a first level;
   supporting the second portion of the substrate on a second support surface at a second level different from the first level; and
   cutting the substrate between the first support surface and the second support surface.

9. The substrate of claim 8, wherein the step of cutting includes punching the substrate.

10. The substrate of claim 8, wherein the substrate has a solder resist layer thereon, and the punching is performed substantially without cracking the solder resist layer.

11. The substrate of claim 8, wherein the substrate has a solder resist layer thereon, and the punching is performed substantially without flexing the substrate.

12. The substrate of claim 8, wherein the step of punching includes punching a cut in the substrate in the form of a straight line segment.

13. The substrate of claim 12, wherein the cut intercepts a pre-drilled hole in the substrate.

14. The substrate of claim 8, wherein the cutting step is performed using a punch having a V-shaped cross section.

15. A substrate having first and second portions, the first portion at a first level and the second portion at a second level, the substrate having a solder resist layer on at least one surface thereof, the substrate having a cut edge that penetrates the solder resist layer, the solder resist layer being substantially free of cracks in a region adjacent to the cut edge.

16. The substrate of claim 15, wherein the cut edge is well defined.

17. An apparatus for cutting a substrate having first and second portions, each portion having a respectively different level, comprising:
   a first support surface at a first level, the first portion of the substrate being supported by the first support surface;
   a second support surface at a second level different from the first level, the second portion of the substrate being supported by the second support surface; and
   a punch that cuts the substrate between the first support surface and the second support surface.

18. The apparatus of claim 17, wherein the first and second support surfaces are first and second die surfaces, respectively.

19. The apparatus of claim 17, further comprising a stripper plate having first and second portions, the punch being positioned between the first and second portions of the stripper plate.

20. The apparatus of claim 17, wherein:
   the first and second support surfaces are first and second die surfaces, respectively,
   the apparatus further comprises a stripper plate having first and second portions,
   the punch is positioned between the first and second portions of the stripper plate,
   the first portion of the substrate is clamped between the first portion of the stripper plate and the first die surface, and
   the second portion of the substrate is clamped between the second portion of the stripper plate and the second die surface.

21. The apparatus of claim 17, wherein the punch punches a cut in the substrate in the form of a straight line segment.

22. The apparatus of claim 21, wherein the cut intercepts a pre-drilled hole in the substrate.

23. The apparatus of claim 17, wherein the punch has a V-shaped cross section.

\* \* \* \* \*